(12) United States Patent
Lee et al.

(10) Patent No.: US 11,647,641 B2
(45) Date of Patent: May 9, 2023

(54) PHOTO-SENSITIVE DEVICE AND A METHOD FOR LIGHT DETECTION IN A PHOTO-SENSITIVE DEVICE

(71) Applicant: IMEC VZW, Leuven (BE)

(72) Inventors: Jiwon Lee, Leuven (BE); Pierre Boulenc, Woluwe Saint Lambert (BE); Kris Myny, Heusden-Zolder (BE)

(73) Assignee: IMEC VZW, Leuven (BE)

( * ) Notice: Subject to any disclaimer, the term of this patent is extended or adjusted under 35 U.S.C. 154(b) by 30 days.

(21) Appl. No.: 17/113,095

(22) Filed: Dec. 6, 2020

(65) Prior Publication Data
US 2021/0175287 A1 Jun. 10, 2021

(30) Foreign Application Priority Data
Dec. 5, 2019 (EP) ..................................... 19213711

(51) Int. Cl.
*H10K 39/32* (2023.01)
*H01L 27/146* (2006.01)
*H04N 25/50* (2023.01)
*H04N 25/79* (2023.01)
*H10K 19/20* (2023.01)
*H10K 30/15* (2023.01)

(52) U.S. Cl.
CPC ....... *H10K 39/32* (2023.02); *H01L 27/14614* (2013.01); *H04N 25/50* (2023.01);
(Continued)

(58) Field of Classification Search
CPC ............. H01L 27/307; H01L 27/14614; H01L 27/14641; H01L 27/286; H01L 51/4233;
(Continued)

(56) References Cited

U.S. PATENT DOCUMENTS

| 2011/0037969 A1* | 2/2011 | Spickermann | ........ G01S 7/4863 356/5.01 |
| 2016/0181325 A1* | 6/2016 | Johnson | ................ H01L 27/307 257/40 |

(Continued)

FOREIGN PATENT DOCUMENTS

| CN | 106783902 A | 5/2017 |
| EP | 3128742 A1 | 2/2017 |

OTHER PUBLICATIONS

Jeon et al: "Gated three-terminal device architecture to eliminate persistent photoconductivity in oxide semiconductor photosensor arrays", Nature Materials, vol. 11, pp. 301-305, 2012.
(Continued)

*Primary Examiner* — Ahmed A Berhan
(74) *Attorney, Agent, or Firm* — Moser Taboada (57) ABSTRACT

A photo-sensitive device comprises: an active layer configured to generate charges in response to incident light; a charge transport layer arranged below the active layer, wherein the charge transport layer comprises a first portion and a second portion being laterally displaced in relation to the first portion; a gate separated by a dielectric material from the charge transport layer, wherein said gate is arranged below the first portion and configured to control a potential thereof; and a transfer gate, which is separated by a dielectric material from a transfer portion of the charge transport layer between the first portion and the second portion, wherein the transfer gate is configured to control transfer of accumulated charges in the first portion to the second portion for read-out of detected light.

15 Claims, 7 Drawing Sheets

(52) U.S. Cl.
CPC ....... *H04N 25/79* (2023.01); *H01L 27/14641* (2013.01); *H01L 27/14649* (2013.01); *H10K 19/20* (2023.02); *H10K 30/152* (2023.02)

(58) Field of Classification Search
CPC .......... H01L 27/14649; H01L 51/4213; H04N 5/351; H04N 5/379; H04N 25/50; H04N 25/79; H10K 39/32; H10K 19/20; H10K 30/152
See application file for complete search history.

(56) References Cited

U.S. PATENT DOCUMENTS

| | | |
|---|---|---|
| 2017/0146657 A1 | 5/2017 | Xu |
| 2019/0123223 A1 | 4/2019 | Astley et al. |
| 2020/0303446 A1 | 9/2020 | Moriwaki |
| 2021/0296382 A1 | 9/2021 | Ono |

OTHER PUBLICATIONS

Wu et al: "High speed global shutter image sensors for professional applications", Proceedings of SPIE, vol. 9522, pp. 95220N-1-95220N-7, 2015.

Arora et al: "Amorphous indium-gallium-zinc-oxide as electron transport layer in organic photodetectors". Applied Physics Letters, vol. 106, pp. 143301-1-143301-4, 2015.

Nishimura et al: "An 8K4K-Resolution 60fps 450ke-Saturation-Signal Organic Photoconductive-Film Global-Shutter CMOS Image Sensor with In-Pixel Noise Canceller", 2018 IEEE International Solid-State Circuits Conference, pp. 82-84, 2018.

* cited by examiner

PHOTO-SENSITIVE DEVICE AND A METHOD FOR LIGHT DETECTION IN A PHOTO-SENSITIVE DEVICE

CROSS-REFERENCE TO RELATED APPLICATIONS

This application claims priority to EPC Application No. 19213711.5, filed on Dec. 5, 2019, which is incorporated herein by reference in its entirety.

TECHNICAL FIELD

The present inventive concept relates to photo-sensitive devices. In particular, the present inventive concept relates to photo-sensitive devices, which may be formed by thin-film technology.

BACKGROUND

Using silicon in light detection sets limits to the wavelengths that may be detected, based on optical characteristics of silicon. Therefore, it is of interest to use other materials in light detection. In this regard, photo-sensitive devices that may be formed using thin-film technology is interesting, since such photo-sensitive devices could be monolithically integrated on semiconductor substrates to still make use of the semiconductor substrate to provide circuitry for read-out and processing of signals from the photo-sensitive devices. This would facilitate e.g. infra-red imaging.

United States Published Patent Application number US 2016/0181325 discloses a CMOS image sensor combining CMOS read-out integrated circuits (ROICs) and photodiode on active pixel (POAP) technology with quantum dot (PbS-CQD) detector material.

A three-transistor pixel circuit is used. Therefore, the pixel structure has high reset noise, due to un-correlated read-out (i.e. a pixel signal is read first, then a reset scheme is applied).

Moreover, the photodiode area is directly connected to a pixel circuit below the photodiode area. Thus, a defective contact region will generate high dark current. In addition, conversion gain may be low because a photodiode capacitance is added to a floating diffusion node where charge-to-voltage conversion takes place. This results in poor noise characteristics and hence may lead to poor image quality.

SUMMARY

It is an object of the present inventive concept to provide a photo-sensitive device with good noise characteristics and high conversion gain. It is a particular object of the present inventive concept to provide such a photo-sensitive device that may be formed by thin-film technology and that may be suited for being combined with a read-out integrated circuit.

This and other objects of the present inventive concept are at least partly met by the invention as defined in the independent claims. Preferred embodiments are set out in the dependent claims.

According to a first aspect, there is provided a photo-sensitive device comprising a layer structure, said photo-sensitive device comprising: an active layer, wherein the active layer is configured to generate charges in response to incident light on the active layer; a charge transport layer, wherein the charge transport layer is formed of a semiconductor and comprises a first portion and a second portion, the second portion being laterally displaced in a plane of the charge transport layer in relation to the first portion; a gate separated by a dielectric material from the charge transport layer, wherein said gate and said charge transport layer are arranged such that the first portion of the charge transport layer is between the gate and the active layer and wherein the gate is configured to control a potential of the first portion of the charge transport layer; and a transfer gate, which is arranged to be separated by a dielectric material from a transfer portion of the charge transport layer between the first portion and the second portion, wherein the transfer gate is configured to control transfer of accumulated charges in the first portion to the second portion for read-out of detected light by the photo-sensitive device.

Thanks to the photo-sensitive device being able to transport charges from a first portion to a second portion of the charge transport layer, modulation of a potential of the charge transport layer in the first portion is enabled. This implies that generation of charges in the charge transport layer can be controlled in an accurate manner. Hence, the photo-sensitive device may have good noise characteristics.

The modulation of the potential of the charge transport layer may be provided by means of the gate arranged below the first portion of the charge transport layer.

The transfer gate may provide control for moving charges from the first portion to the second portion after accumulation. Thus, once the charges have been accumulated in the first portion, the charges may be transferred to the second portion, wherein a signal may be read out.

The active layer may be configured to absorb incident light to generate charges. Thus, an amount of charges generated is indicative of an amount of incident light on the active layer. The generated charges may be transported through the active layer and accumulated in the charge transport layer.

The active layer may be sandwiched between charge transport layers for collecting holes and electrons, respectively. The charge transport layer arranged below the active layer may be a hole transport layer or an electron transport layer.

The charge transport layer and the active layer may be arranged in separate, parallel planes. The photo-sensitive device may be oriented such that the charge transport layer is above the gate and, in such case, the active layer is above the charge transport layer.

It should be realized that a layer defined as being arranged "above"/"on" or "below" another layer, need not be arranged directly on top of or directly below the other layer. Rather, there may be other intermediate layers in-between.

According to an embodiment, the gate is configured to provide a voltage for fully depleting the first portion of the charge transport layer.

The photo-sensitive device is configured such that it is possible to achieve full depletion of the first portion of the charge transport layer wherein charges are accumulated. It is also advantageous to configure the photo-sensitive device such that the gate will provide a voltage so that the first portion will be fully depleted.

Full depletion is beneficial in providing good noise characteristics of the photo-sensitive device, since reset noise may be limited, a dark current may be limited and a high conversion gain may be provided.

According to an embodiment, the active layer and charge transport layer are arranged on a read-out integrated circuit substrate.

The charge transport layer may be arranged between the substrate and the active layer.

This implies that the photo-sensitive device may be integrated with a substrate on which read-out integrated circuit is provided. This ensures that the photo-sensitive device with read-out circuitry may be very compact and allows processing of detected signals in a small-scale device. The read-out integrated circuit may be used for reading out signals of detected amount of light, but may also be used for more advanced processing of the signals.

The read-out integrated circuit may be formed by semiconductor technology, such as using complementary metal-oxide-semiconductor (CMOS) circuitry. Thus, the photo-sensitive device may make use of existing technology for manufacturing of small-scale circuitry.

The active layer and charge transport layer may be formed on a silicon CMOS wafer, on which a read-out integrated circuit is formed. However, it should be realized that the active layer and charge transport layer may alternatively be formed on other substrates, such as a thin-film technology wafer, which may for example use organic materials.

It should be realized that the active layer and the charge transport layer may be arranged in different relations to a read-out integrated circuit. For instance, the active layer and the charge transport layer may be arranged on top of the read-out integrated circuit on the substrate. However, in another embodiment, the active layer and the charge transport layer may be arranged on a common substrate with the read-out integrated circuit, but the active layer and the charge transport layer of the photo-sensitive device may be arranged next to the read-out integrated circuit on the substrate. For instance, the active layer and the charge transport layer of the photo-sensitive device and the read-out integrated circuit may be arranged on the same polyimide substrate. In such case, the read-out integrated circuit may be designed by using thin-film technology.

According to an embodiment, the active layer comprises a quantum dot, an organic photodetector material or a perovskite material.

These materials may allow detection of light in different wavelength intervals. Thus, the photo-sensitive device may for instance be used for detecting infrared light, which may not be possible if silicon is used for light detection.

Use of quantum dot, organic photodetector material and perovskite materials may be well suited to the configuration of the photo-sensitive device. However, it should be realized that it may also be possible to use other materials.

According to an embodiment, wherein the active layer and charge transport layer are formed using thin-film layer deposition.

Thin-film layer deposition may be suitable for monolithic integration of structures using vast amount of materials, e.g. organic materials. This may be advantageously used in the photo-sensitive device, which may be suited for use of e.g. organic materials in light detection.

According to an embodiment, the charge transport layer is an electron transport layer and the photo-sensitive device further comprises a hole transport layer arranged such that the active layer is between the hole transport layer and the electron transport layer.

It may be particularly suitable to use an electron transport layer as the charge transport layer. Suitable materials may be readily available.

According to an embodiment, the photo-sensitive device further comprises a top electrode layer arranged above the hole transport layer, wherein the top electrode layer is configured to control a potential of the hole transport layer.

Thus, the active layer and the charge transport layers are arranged between two electrodes controlling potential of the layers to control function of the photo-sensitive device.

The top electrode layer may be configured to be transparent to relevant wavelengths (to be detected by the photo-sensitive device) to ensure that the light is passed to the active layer for detection with high sensitivity.

According to another embodiment, the charge transport layer is a hole transport layer and wherein the photo-sensitive device further comprises an electron transport layer arranged such that the active layer is between the electron transport layer and the hole transport layer. Thus, it should be realized that the photo-sensitive device need not necessarily be formed using an electron transport layer as the charge transport layer for detecting the amount of light incident on the photo-sensitive device, but rather a hole transport layer may alternatively be used.

According to an embodiment, the charge transport layer is formed by a metal-oxide semiconductor.

This may ensure that the charge transport layer may be formed by a suitable material. Various alternatives exist, such as indium-gallium-zinc oxide (IGZO), indium-tin-zinc-oxide or hafnium-indium-zinc-oxide using an n-type semiconductor. Other alternatives are tin-oxide, copper-oxide, selenides and sulfides using a p-type semiconductor.

According to an embodiment, the gate and the transfer gate are arranged on different sides of the charge transport layer or the gate and the transfer gate are arranged on a same side of the charge transport layer or the transfer gate comprises a first portion and a second portion, wherein the first portion of the transfer gate and the second portion of the transfer gate are arranged on opposite sides of the charge transport layer.

Thus, the transfer gate may be arranged in different configurations in relation to the charge transport layer. The transfer gate may be arranged to provide a well-controlled transfer of charges from the first portion to the second portion of the charge transport layer.

According to a second aspect, there is provided an image sensor comprising an array of photo-sensitive devices according to the first aspect.

Effects and features of this second aspect are largely analogous to those described above in connection with the first aspect. Embodiments mentioned in relation to the first aspect are largely compatible with the second aspect.

Thus, the photo-sensitive devices may be used for forming an imaging sensor to enable imaging. For instance, this may be very useful for infrared imaging.

In an image sensor, components of the photo-sensitive devices may be shared. This implies that a number of transistors may be used efficiently in the array in relation to the number of photo-sensitive devices. For instance, a read-out integrated circuit associated with the array of photo-sensitive devices may be arranged such that one or more transistors of the read-out integrated circuit are shared per photo-sensitive device.

According to an embodiment, at least a second portion of a first photo-sensitive device in the array and a second portion of a second photo-sensitive device in the array are shared in the charge transport layer.

This implies that a floating diffusion node of the first and the second photo-sensitive device may be shared. Hence, a number of transistors per photo-sensitive device may be reduced, which may ensure that size of each photo-sensitive device may be reduced for enabling high resolution imaging.

In one embodiment, the second portion of four photo-sensitive devices are shared. In such case, the number of transistors per photo-sensitive device may be reduced to 1.75.

According to a third aspect, there is provided a method for light detection in a photo-sensitive device comprising a layer structure, said method comprising: generating charges in an active layer in response to incident light on the active layer; accumulating charges, based on the generated charges, in a first portion of a charge transport layer; transferring charges from the first portion of the charge transport layer to a second portion of the charge transport layer, the second portion being laterally displaced in a plane of the charge transport layer in relation to the first portion; said transferring of charges being controlled by a signal to a transfer gate, wherein the transfer gate is arranged to be separated by a dielectric material from a transfer portion of the charge transport layer between the first portion and the second portion; reading out a signal from the second portion of the charge transport layer as a representation of an amount of incident light on the active layer.

Effects and features of this third aspect are largely analogous to those described above in connection with the first and second aspects. Embodiments mentioned in relation to the third aspect are largely compatible with the first and second aspects.

Thanks to the accumulation of charges being performed in a first portion of the charge transport layer and the charges then being transferred to a second portion of the charge transport layer, it is possible to modulate a potential of the charge transport layer in the first portion. This implies that generation of charges in the charge transport layer can be controlled in an accurate manner. Hence, the light detection in the photo-sensitive device may be performed with good noise characteristics.

According to an embodiment, the method further comprises, before generating of charges in the active layer, depleting the charge transport layer based on a voltage provided to a gate separated by a dielectric material from the charge transport layer, wherein said gate and said charge transport layer are arranged such that the first portion of the charge transport layer is between the gate and the active layer.

Full depletion of the charge transport layer is beneficial in providing good noise characteristics of the photo-sensitive device, since reset noise may be limited, a dark current may be limited and a high conversion gain may be provided.

According to an embodiment, the charge transport layer is an electron transport layer and the transfer gate is controlled such that a potential of the transfer portion is lower than a potential of the first portion during accumulating of charges, and wherein the transfer gate is controlled such that a potential of the transfer portion is set to be higher than a potential of the first portion and lower than a potential of the second portion during transferring of charges.

The transfer gate and the gate arranged below the first portion of the charge transport layer may be controlled to ensure that charges are accumulated in the first portion and then transferred to the second portion when read-out is to be performed. By setting the potential of the transfer portion to be lower than the potential of the first portion, charges will be accumulated in the first portion and may not move from the first portion to the transfer portion. Further, by setting the potential of the transfer portion to be higher than the potential of the first portion, charges will be transferred from the first portion to the transfer portion. By the potential of the transfer portion further being lower than the potential of the second portion, the charges transferred from the first portion to the transfer portion will be further transferred from the transfer portion to the second portion.

Thus, a controlled transfer of charges may be achieved for accumulating charges and reading out signals based on the accumulated charges.

The transfer of charges from the first portion may remove all charges from the first portion to deplete the first portion.

According to another embodiment, the charge transport layer is a hole transport layer and the transfer gate is controlled such that a potential of the transfer portion is higher than a potential of the first portion during accumulating of charges, and wherein the transfer gate is controlled such that a potential of the transfer portion is set to be lower than a potential of the first portion and higher than a potential of the second portion during transferring of charges.

Thus, a controlled transfer of charges may be achieved using a hole transport layer.

According to another embodiment, a constant gate voltage is provided to the gate throughout said depleting, generating, accumulating and transferring.

By setting a level of the gate voltage properly, the gate voltage provided to the gate arranged below the first portion of the charge transport layer need not be varied. Rather, a constant gate voltage may be provided, i.e. a DC signal may be provided to the gate. This implies that control of the gate is very simple and need not be accurately timed.

However, according to another embodiment, a high gate voltage is provided to the gate for biasing the photo-sensitive device to accumulate charges in the first portion of the charge transport layer and a low gate voltage is provided when transferring charges.

The low gate voltage is defined as "low" in that it is lower than the high gate voltage.

The low gate voltage may bias the photo-sensitive device such that the charge transport layer in the first portion is fully depleted when charges have been transferred from the first portion to the second portion.

BRIEF DESCRIPTION OF THE DRAWINGS

The above, as well as additional objects, features and advantages of the present inventive concept, will be better understood through the following illustrative and non-limiting detailed description, with reference to the appended drawings. In the drawings like reference numerals will be used for like elements unless stated otherwise.

DETAILED DESCRIPTION

Figure 1:
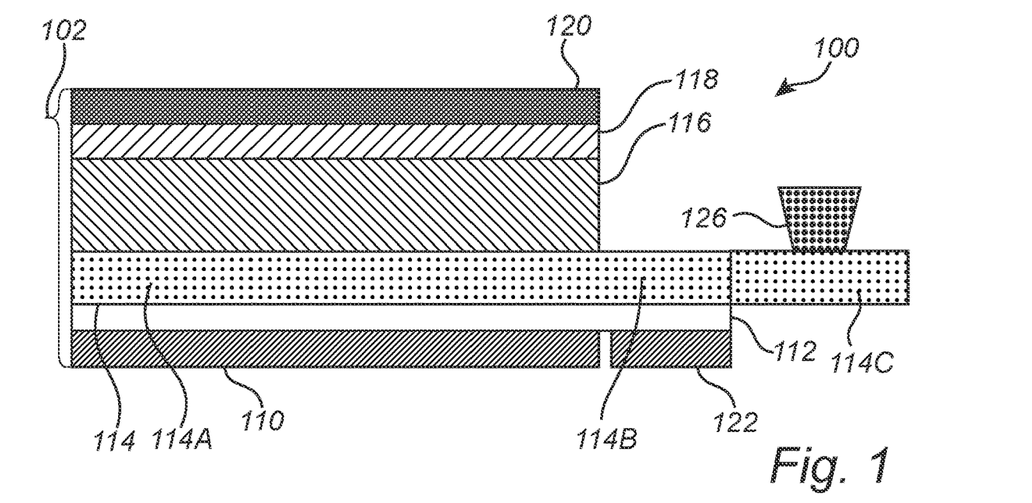
FIG. 1 is a schematic cross-sectional view of a photo-sensitive device according to a first embodiment.

FIG. 1 illustrates a photo-sensitive device 100. The photo-sensitive device 100 comprises a layer structure 102 for detecting incident light and converting incident light to a signal corresponding to the amount of incident light.

The layer structure 102 of the photo-sensitive device 100 may be suitable for being formed by thin-film layer deposition. This may ensure that the photo-sensitive device 102 may be very compact and small-size and may also facilitate use of the photo-sensitive device 102 in combination with a read-out integrated circuit, which may also be formed using thin-film technology or which may be formed by semiconductor processing on a semiconductor substrate. It should however be realized that the layer structure 102 need not necessarily be formed using thin-film layer deposition.

The photo-sensitive device 100 may comprise an active layer 116, which may be configured to absorb light and generate charges based on the absorbed light. Thus, electron-hole pairs may be generated by the active layer based on light being absorbed. The electron charges and hole charges may be transferred to respective charge transport layers 114, 118 on opposite sides of the active layer 116 such that the active layer 102 may be sandwiched between the charge transport layers 114, 118. Thus, generated electron charges may be transferred to an electron transport layer 114 and generated hole charges may be transferred to a hole transport layer 118.

The photo-sensitive device 100 may comprise electrodes 110, 120 on opposite sides of the charge transport layers 114, 118. The electrodes 110, 120 may be configured to provide an electric field for driving charges generated in the active layer 116 towards the electron transport layer 114 and hole transport layer 118, respectively.

Thus, when light is incident on the active layer 116, charges will be generated and accumulated in the electron transport layer 114, whereas charges may be transported to the hole transport layer 118 and be drained through the electrode 120. The accumulation of charges in the electron transport layer 114 and the hole transport layer 118 prevents or at least reduces recombination of holes and electrons in the active layer 116 to ensure that a high efficiency in light detection is provided by the photo-sensitive device 100.

The active layer 116 may be sensitive to a particular, that is a specific, predetermined or selective, range of wavelengths of light. The range of wavelengths may be narrow to allow detection of a specific wavelength, but the range of wavelengths may alternatively be broad such that the photo-sensitive device 100 may be able to generally detect an amount of light over a broad range, such as covering the range of visible light and extending into the range of infrared light. In the latter case, the photo-sensitive device 100 may be combined with a filter such that the filter may select which range of wavelengths that should be detected by the photo-sensitive device 100. Also, having an active layer 116 which is sensitive to a broad range of wavelengths would allow using the same type of active layer 116 within an array of photo-sensitive devices 100, wherein different photo-sensitive devices 100 in the array may be associated with different filters for providing spectrally resolved imaging. Hence, spectrally resolved imaging would not require using different materials for the active layer 102 in different photo-sensitive devices 100.

In particular, the active layer 116 may be formed from a material which is sensitive to wavelengths in the infrared range. Thus, the photo-sensitive device 100 may be used for infrared detection, which may not be achieved with photo-sensitive devices using silicon for light detection. Thus, the photo-sensitive device 100 may be particularly interesting to use for detection of infrared light. However, it should be understood that the photo-sensitive device 100 may also be well suited for detection of visible light by proper selection of the active layer 116.

The active layer 116 may be formed from various different materials. In particular, the photo-sensitive device 100 is well suited for using an organic material in the active layer 116, such as an organic semiconductor material.

The active layer 116 may, for example, comprise a quantum dot, an organic photodetector material or a perovskite material. Such materials may be suitable for use in manufacturing of the photo-sensitive device 100 using thin-film technology. Also, such materials may be used for selecting a sensitivity of wavelengths of light of the photo-sensitive device 100 to enable using the photo-sensitive device 100 in various different applications spanning a broad range of wavelengths of light from ultraviolet light to infrared light.

However, it should be understood that the photo-sensitive device 100 is not necessarily limited to use of the particular examples of materials of the active layer 116 provided herein. Rather, other materials may also be available and used with the photo-sensitive device 100.

The light to be detected may be incident on a top electrode 120 arranged above the active layer 116 such that light encounters the top electrode 120 before reaching the active layer 116. However it should be understood that the photo-sensitive device 100 may alternatively be configured for back-side illumination such that light to be detected may be incident on a bottom electrode 110 below the active layer 116 such that light encounters the bottom electrode 110 before reaching the active layer 116.

The top electrode 120 may be formed from a material that is transparent to relevant wavelengths (to be detected by the photo-sensitive device 100) to ensure that the light is passed to the active layer for detection with high sensitivity. For instance, the top electrode 120 may be formed by indium tin oxide.

The electrodes 110, 120 may be configured to control a potential of the charge transport layers 114, 118 to control function of the photo-sensitive device 100. The top electrode 120 sets a potential of the charge transport layer 118 above the active layer 116 and a bottom electrode 110 sets a potential of the charge transport layer 114 below the active layer 116.

The bottom electrode 110 arranged below the active layer 116 and below the charge transport layer 114 may be formed as a gate 110 for controlling the potential of the charge transport layer 114. The gate 110 may thus be separated from the charge transport layer 114 by a dielectric material 112.

The bottom electrode 110 may e.g. be formed by a gate metal or polysilicon or a transparent material such as indium tin oxide in case the photo-sensitive device 100 is used for back-side illumination. The bottom electrode 110 may be separated by a layer of a dielectric material 112, such as $SiO_2$, from the charge transport layer 114. The bottom electrode 110 may thus be well suited for being formed by semiconductor processing on a semiconductor substrate, which may be combined with the remaining layers of the layer structure 102 by forming these layers on top of the semiconductor substrate using thin-film layer deposition.

The gate 110 may be arranged below a first portion 114a of the charge transport layer 114 to control a potential of the first portion 114a.

The charge transport layer 114 may comprise the first portion 114a, a transfer portion 114b and a second portion 114c, which are arranged in different lateral areas of a plane of the charge transport layer 114.

The charge transport layer 114 may further be configured to be controlled for controlling accumulation of charges in the first portion 114a and controlling transfer of charges from the first portion 114a to the second portion 114c via the transfer portion 114b. The control of the charge transport layer 114 may be provided by the gate 110 for controlling a potential of the first portion 114a and a transfer gate 122 for controlling a potential of the transfer portion 114b.

The transfer gate 122 may be arranged adjacent to the gate 110 and may be separated by the same layer of dielectric material 112 from the charge transport layer 114. The transfer gate 122 may e.g. be formed by a gate metal or polysilicon.

The transfer gate 122 may be configured to control transfer of charges from the first portion 114a to the second portion 114c. Thus, a signal may be provided to the transfer gate 122 to allow or prevent charges to be transferred from the first portion 114a to the second portion 114c.

The second portion 114c may form a floating diffusion node for read-out of a signal representing an amount of light detected by the photo-sensitive device 100. The transfer gate 122 may thus be switched ON or OFF to connect (or disconnect) the photo-sensitive device 100 to the floating diffusion.

As mentioned above and shown in FIG. 1, the transfer gate 122 may be arranged below the charge transport layer 114. However, referring now to FIGS. 2a-b, alternative arrangements of the transfer gate 122 may be provided.

Figure 2A:
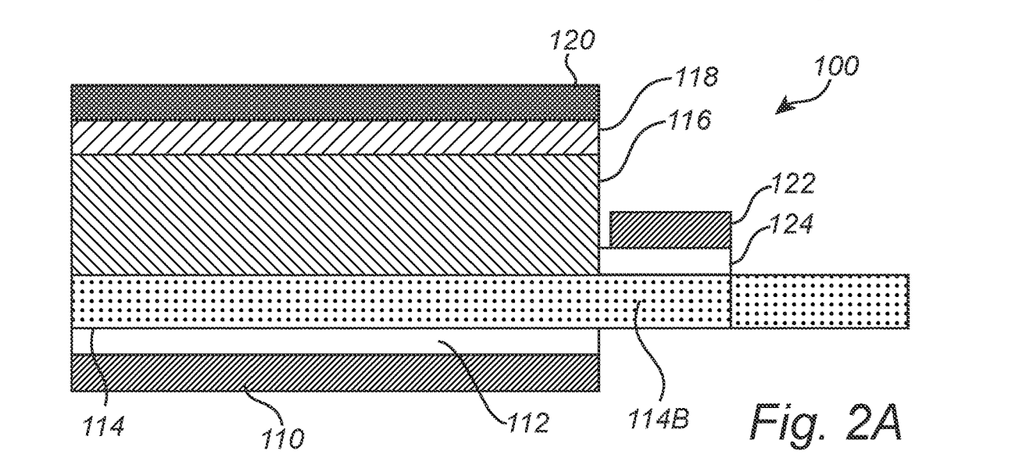
FIG. 2a is a schematic cross-sectional view of a photo-sensitive device according to a second embodiment with a different arrangement of a transfer gate.

As shown in FIG. 2a, the transfer gate 122 may be arranged above the transfer portion 114b of the charge transport layer 114 forming a front-gate type transistor. In such case, a layer of dielectric material 124 may be arranged between the charge transport layer 114 and the transfer gate 122.

Figure 2B:
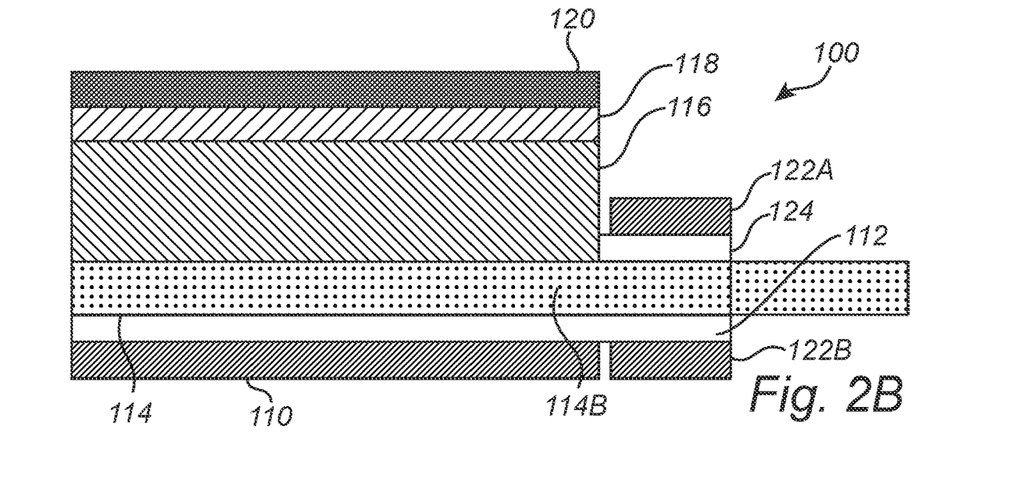
FIG. 2b is a schematic cross-sectional view of a photo-sensitive device according to a third embodiment with yet another different arrangement of the transfer gate.

As shown in FIG. 2b, the transfer gate 122 may comprise a first portion 122a and a second portion 122b, wherein the first portion 122a of the transfer gate 122 is arranged above the charge transport layer 114 and the second portion 122b of the transfer gate 114 is arranged below the charge transport layer 114. Thus, the transfer gate 114 may form a dual-gate type transistor.

The gate 110 and the transfer gate 122 may be provided with voltage signals for controlling potentials of the first portion 114a and the transfer portion 114b, respectively, of the charge transport layer 114. The voltage signals may be set such that, when the charges are removed from the first portion 114a by switching on the transfer gate 122, the charges may be completely removed from the first portion 114a of the charge transport layer 114.

Thus, a potential of the first portion 114a of the charge transport layer 114 may be modulated from below the charge transport layer 114, which may be used to ensure full depletion of the first portion 114a. The modulation of the potential of the first portion 114a of the charge transport layer 114 may be achieved without affecting the read-out of signals from the charge transport layer 114.

Full depletion is beneficial in providing good noise characteristics of the photo-sensitive device 100, which may be useful in e.g. providing high image quality based on detection of light by an array of photo-sensitive devices 100.

The full depletion of the first portion 114a allows reset noise of the photo-sensitive device 100, i.e. a signal level of the photo-sensitive device 100 remaining after reset of a floating diffusion node, to be limited. Also, a dark current, i.e. a current signal when no light is incident on the photo-sensitive device 100, may be limited. Further, the photo-sensitive device 100 may provide a high conversion gain.

The charge transport layer 114 may be configured to accumulate charges in the first portion 114a. Thus, the first portion 114a may be arranged below the active layer 116 and may be covered by the active layer 116. The active layer 116, the charge transport layer 118 and the top electrode 120 may be arranged above only the first portion 114a of the charge transport layer 114. In other words, a projection of the active layer 116, the charge transport layer 118 and the top electrode 120 onto the plane of the charge transport layer 114 may cover only the first portion 114a of the charge transport layer 114 (or a part of the first portion 114a). This implies that the charges will only be accumulated in the first portion of the charge transport layer 114a. However, it is possible that the active layer 116 could be arranged partly above the transfer portion 114b as well.

The second portion 114c of the charge transport layer 114 may be connected to read-out circuitry, as indicated by connection 126 in FIG. 1. The read-out circuitry may be formed as an integrated circuit which may be formed by semiconductor technology, such as using complementary metal-oxide-semiconductor (CMOS) circuitry. Thus, the photo-sensitive device 100 may make use of existing technology for manufacturing of small-scale circuitry.

The photo-sensitive device 100 may be integrated with a substrate on which read-out integrated circuit is provided. This ensures that the photo-sensitive device 100 with read-out circuitry may be very compact and allows processing of detected signals in a small-scale device. The read-out integrated circuit may be used for reading out signals of detected amount of light, and may also be used for more advanced processing of the signals.

The photo-sensitive device 100 may be integrated on a silicon CMOS wafer, on which a read-out integrated circuit is formed. However, it should be realized that the photo-sensitive device 100 may alternatively be formed on other substrates, such as a thin-film technology wafer, which may, for example, use organic materials and on which the read-out integrated circuit may be formed.

It should be realized that the layer structure 102 of the photo-sensitive device 100 may be arranged in various, alternate and/or different relations to a read-out integrated circuit. For instance, the layer structure 102 may be arranged on top of the read-out integrated circuit on the substrate. However, in another embodiment, the layer structure 102 may be arranged on a common substrate with the read-out integrated circuit, but the layer structure 102 of the photo-sensitive device 100 may be arranged next to the read-out integrated circuit on the substrate, e.g. in a common plane. For instance, the layer structure 102 of the photo-sensitive device 100 and the read-out integrated circuit may be arranged on the same polyimide substrate. In such case, the read-out integrated circuit may be designed by using thin-film technology.

It should be realized that the second portion 114c of the photo-sensitive device 100 may in another alternative be connected to a wire for transferring a signal from the second portion 114c. The wire may be connected to a separate substrate, such that the read-out integrated circuit need not even be provided on the same substrate as the photo-sensitive device 100.

According to an embodiment, the charge transport layer 114 arranged below the active layer 116 is an electron transport layer 114.

The electron transport layer 114 may be formed by a n-type metal-oxide semiconductor. Various alternatives exist, such as indium-gallium-zinc oxide (IGZO), e.g. amorphous IGZO, indium-tin-zinc-oxide or hafnium-indium-zinc-oxide.

In such embodiment, the charge transport layer 118 arranged above the active layer 116 may be a hole transport layer 118.

According to another embodiment, the charge transport layer 114 arranged below the active layer 116 is a hole transport layer 114.

The hole transport layer 114 may be formed by a p-type metal-oxide semiconductor. Various alternatives exist, such as tin-oxide, copper-oxide, selenides and sulfides.

In such embodiment, the charge transport layer 118 arranged above the active layer 116 may be an electron transport layer 118.

Figure 3:
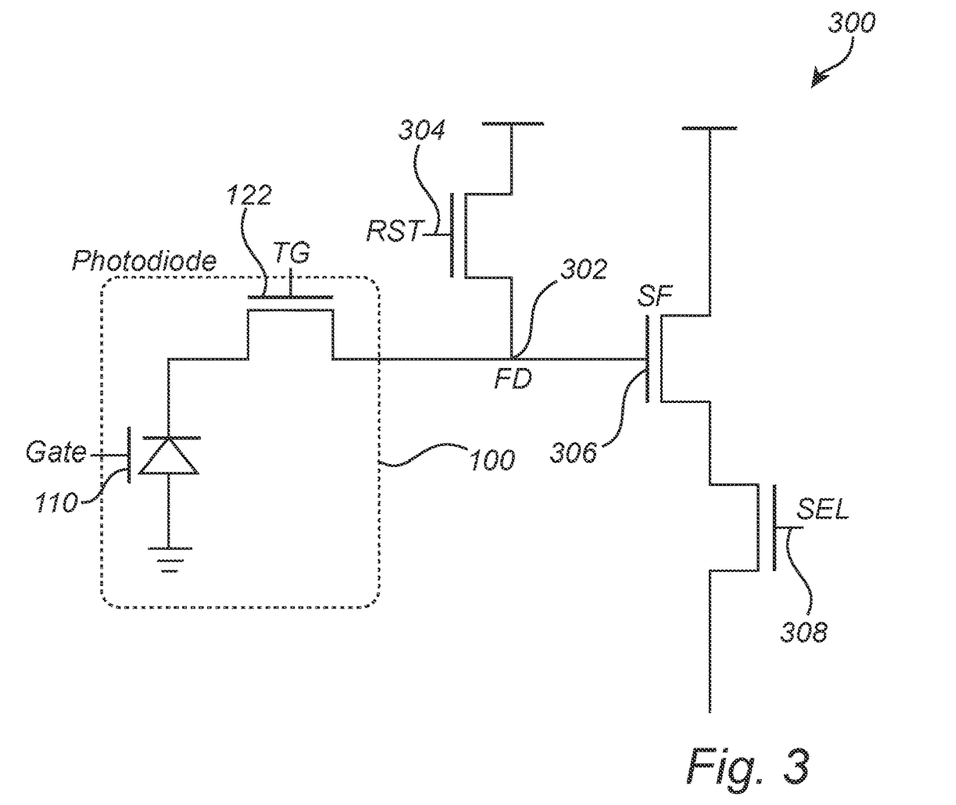
FIG. 3 is a schematic view of a circuitry for reading out a signal of the photo-sensitive device.

Referring now to FIG. 3, the photo-sensitive device 100 is illustrated in a circuitry 300 for reading out a signal of the photo-sensitive device 100.

The circuitry 300 may comprise the photo-sensitive device 100 that is configured to detect incident light. The gate 110 is used for modulating a potential of the first portion 114a of the charge transport layer 114 such that the first portion 114a may be fully depleted when accumulated charges are removed from the first portion 114a. The transfer gate 122 is used for controlling connection of the photo-sensitive device 100 to a floating diffusion node 302 for reading out a signal representing an amount of detected light by the photo-sensitive device 100.

The circuitry 300 may further comprise a reset transistor 304 for resetting the floating diffusion node 302 before a signal is read out from the photo-sensitive device 100.

The floating diffusion node 302 may be connected to a gate of a source follower transistor 306. A source of the source follower transistor 306 may further be connected to a select transistor 308. A signal to the select transistor 308 may select the source follower transistor 306 to be connected to a read-out line for reading out the signal on the floating diffusion node 302.

As illustrated in FIG. 3, the photo-sensitive device 100 may thus be arranged in a 4-transistor pixel. However, as will be discussed below, transistors of the circuitry 300 may be shared by two or more pixels such that the number of transistors per pixel may be reduced.

Figure 4:
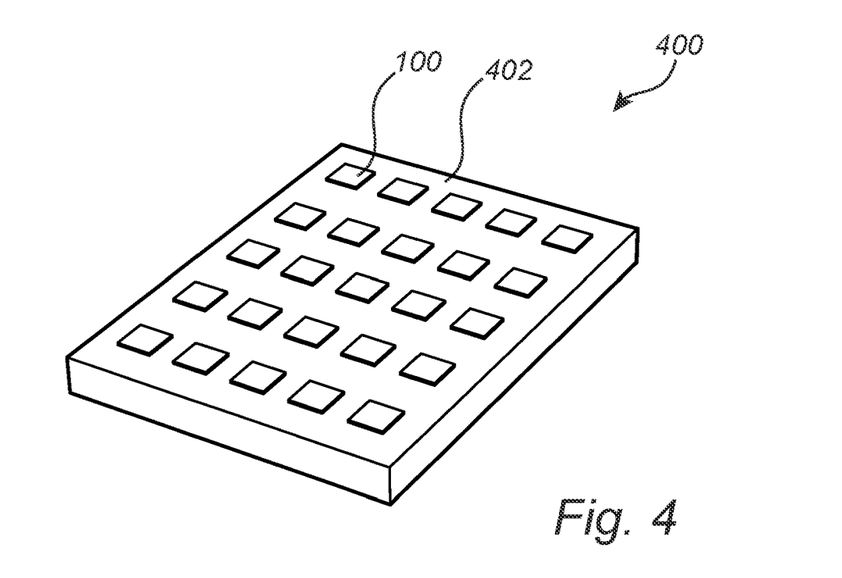
FIG. 4 is a schematic view of an image sensor according to an embodiment.

Referring now to FIG. 4, the photo-sensitive device 100 may be used in an array 402. The array 402 may thus enable detection of a plurality of signals representing incident light on respective photo-sensitive devices 100 in the array 402. This may for instance be used for acquiring a spatially and/or spectrally resolved image. The array 402 of photo-sensitive devices 100 may thus e.g. be used in an image sensor 400.

Figure 5A:
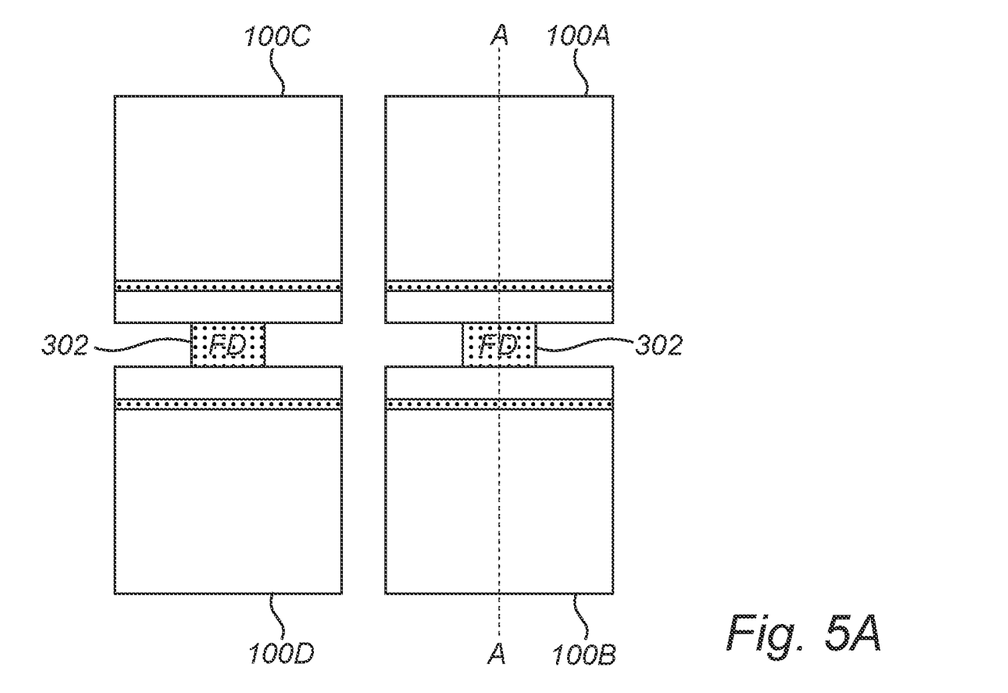
FIGS. 5a-b are schematic views illustrating sharing of floating diffusion nodes between photo-sensitive devices.
Figure 5B:
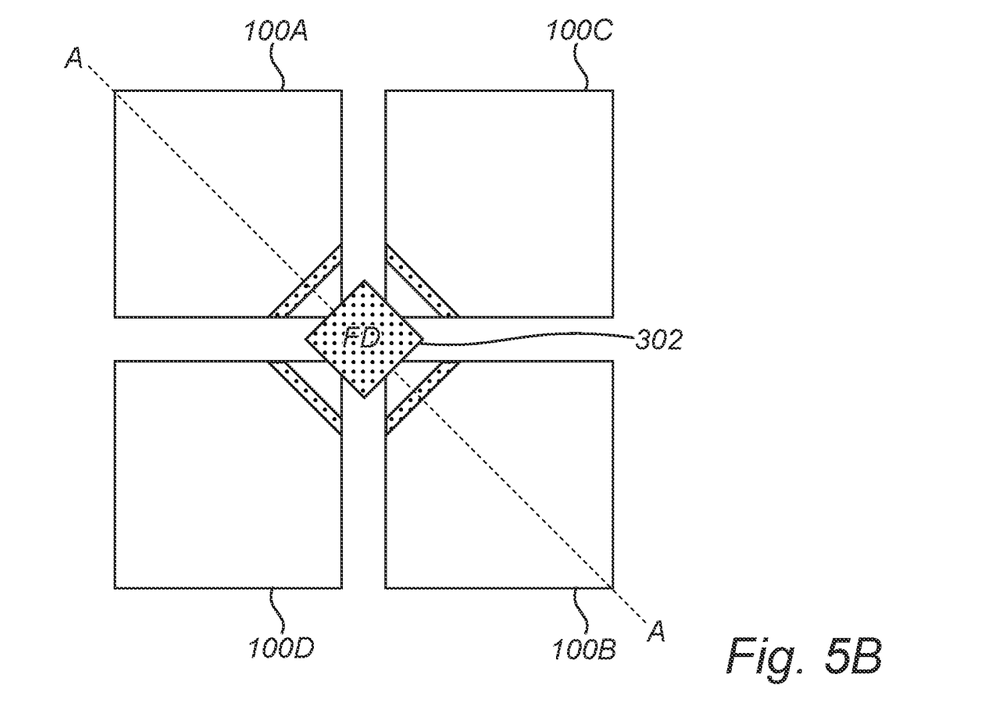

Referring now to FIGS. 5a-b, sharing of components of the photo-sensitive device 100 is illustrated. Thanks to the charge transfer capability controlled by the transfer gate 122, sharing of the floating diffusion node 302 and pixel transistors is possible. By sharing pixel transistors, space efficient layer of the photo-sensitive devices 100 is enabled.

As shown in FIG. 5a, the floating diffusion node 302 may be shared by two photo-sensitive devices 100a-b and 100c-d. In this case, the second portion 114c of a first photo-sensitive device 100a and the second portion 114c of a second photo-sensitive device 100b is shared.

As shown in FIG. 5b, the floating diffusion node 302 may be shared by four photo-sensitive devices 100a-d. In this case, the second portion 114c of each of a first photo-sensitive device 100a, a second photo-sensitive device 100b, a third photo-sensitive device 100c and a fourth photo-sensitive device 100d is shared.

Figure 6:
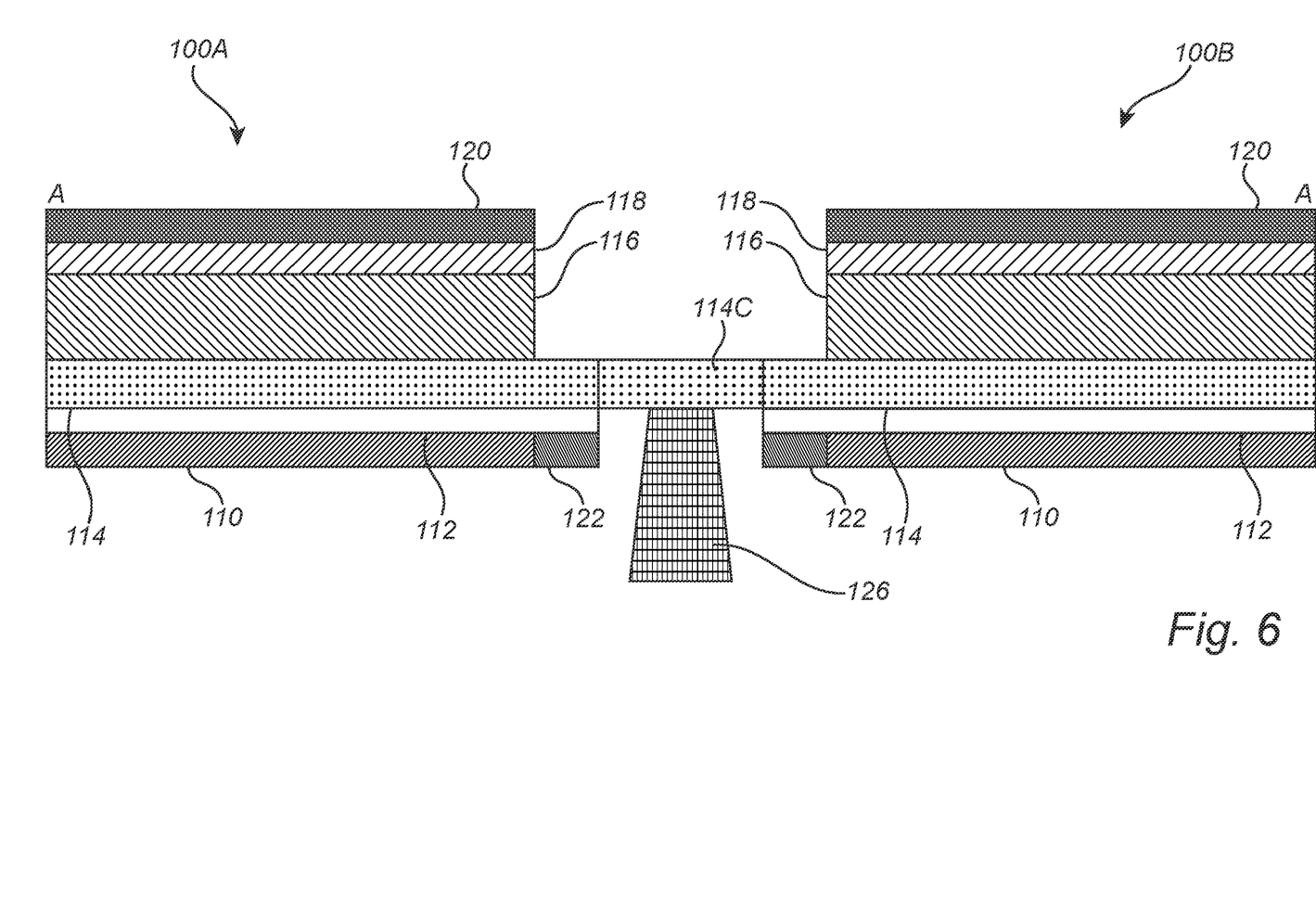
FIG. 6 is a schematic cross-sectional view of the photo-sensitive devices of FIGS. 5a-b taken along lines A-A.

In FIG. 6, a cross-section taken along line A-A in FIG. 5a or in FIG. 5b is illustrated (the cross-section will look the same for both FIG. 5a and FIG. 5b). The cross-section shows two photo-sensitive devices 100a-b sharing the second portion 114c of the charge transport layer 114. The second portion 114c may be connected to read-out circuitry as illustrated in FIG. 6.

With sharing of the second portion 114c in plural photo-sensitive devices 100a-d the transistors for read-out of the signal from the photo-sensitive devices 100a-d may be shared. Hence, the reset transistor 304, the source follower transistor 306 and the select transistor 308 may be shared by all the photo-sensitive devices 100a-d that share the second portion 114c. The signals from the photo-sensitive devices 100a-d may be sequentially read-out from the second portion 114c by sequentially switching on the transfer gates 122 of the photo-sensitive devices 100a-d to provide the signal from the respective photo-sensitive devices 100a-d to the floating diffusion node 302 and by resetting the floating diffusion node 302 between sequential read-outs.

In the embodiment of FIG. 5b, wherein the second portion 114c of four photo-sensitive devices 100a-d is shared, the number of transistors per photo-sensitive device 100a-d may be reduced to 1.75.

Further, in the array 402 of photo-sensitive devices 100, top electrodes 120 may be shared by a plurality of photo-sensitive devices 100 to simultaneously control the potential of the charge transport layer 118 of a plurality of photo-sensitive devices 100.

Figure 7:
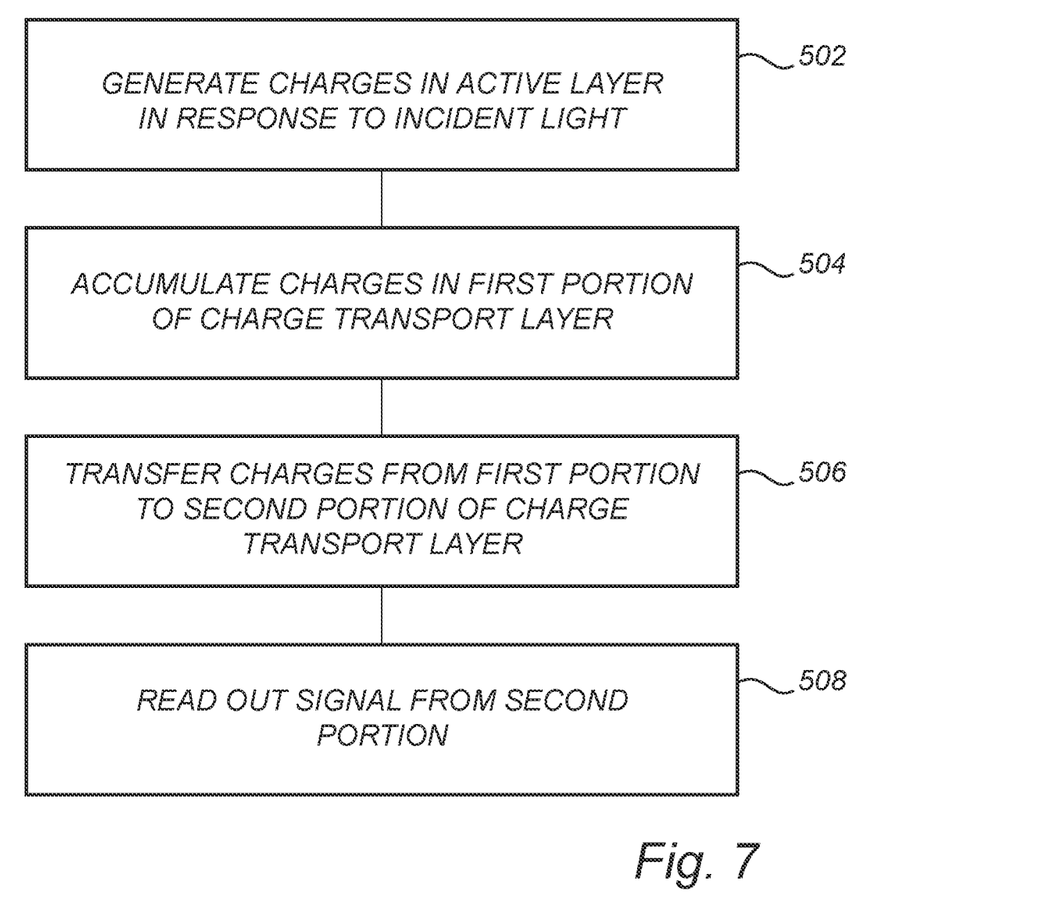
FIG. 7 is a flow chart of a method according to an embodiment.

Referring now to FIG. 7, a method for light detection in a photo-sensitive device 100 will be described.

The method may comprise generating 502 charges in an active layer 116 in response to incident light. The method may further comprise accumulating 504 charges, based on the generated charges, in a first portion 114a of a charge transport layer 114, which is arranged below the active layer 116.

The method may further comprise transferring 506 charges from the first portion 114a of the charge transport layer 114 to a second portion 114c of the charge transport layer 114. The transferring of charges may be controlled by a signal to a transfer gate 122, which is configured to control a potential of a transfer portion 114b of the charge transport layer 114 between the first portion 114a and the second portion 114c.

The method may further comprise reading out 508 a signal from the second portion 114c of the charge transport layer 114 as a representation of an amount of incident light on the active layer 116.

Before the charges are transferred to the second portion 114c of the charge transport layer, a reset signal may be provided by the reset transistor 304 to reset the charges in the second portion 114c and a reset sampling operation may also be performed to read out a signal from the second portion 114c after reset and before the charges are transferred from the first portion 114a of the charge transport layer 114 to the second portion 114c of the charge transport layer 114.

A potential of the first portion 114a of the charge transport layer 114 may further be modulated using a gate 110 arranged below the first portion 114a of the charge transport layer 114. The potential of the first portion 114a may be set such that when the charges are transferred from the first portion 114a to the second portion 114c, all charges are removed and the first portion 114a may be fully depleted before a following sequence of generating charges in the active layer 116 and accumulating charges in the first portion 114a of the charge transport layer 114.

Figure 8:
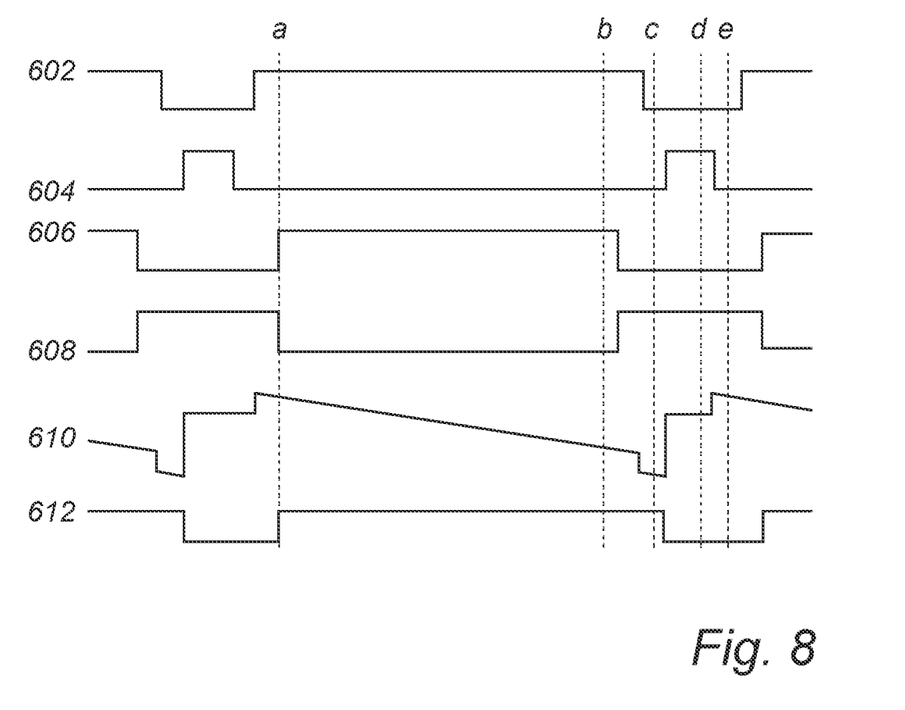
FIG. 8 is a schematic view illustrating operation timing of control signal to transistors for read-out of a signal of a photo-sensitive device.
Figure 9:
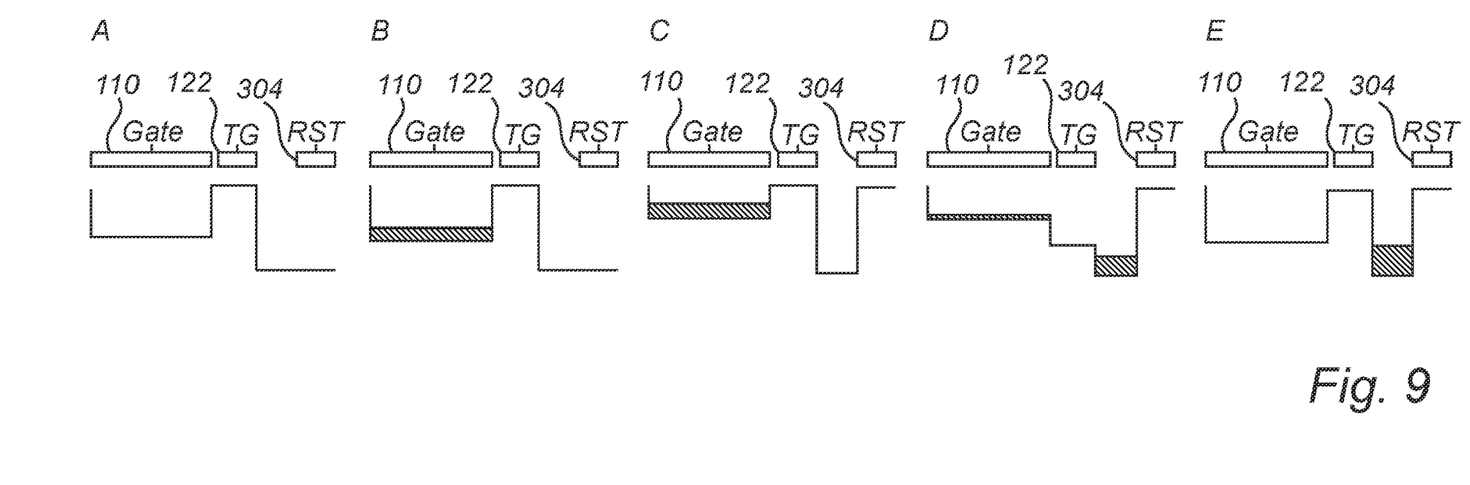
FIG. 9 is a diagram of potentials of different portions of a charge transport layer corresponding to the timing of control signals illustrated in FIG. 8.

Referring now to FIG. 8-9, a possible operation timing of control signal to transistors is illustrated in FIG. 8 and a corresponding potential diagram of potentials of the first portion 114a, the transfer portion 114b and the second portion 114c is illustrated in FIG. 9.

Thus, in FIG. 8, the control signal 602 provided to the gate 110, the control signal 604 provided to the transfer gate 122, the control signal 606 provided to the reset transistor 304, and the control signal 608 provided to the select transistor 308 are illustrated. Also, a potential 610 of the first portion 114a of the charge transport layer 114 and a potential 612 of the floating diffusion node 302 is illustrated.

When integration starts (indicated by timing a in FIG. 8 and by part (a) of FIG. 9), gate potential is high and transfer gate is low. The first portion 114a is in an empty state, which means that it is fully depleted. As the photo-generated charges are accumulated, the potential of the first portion 114b decreases, indicated by timing b in FIG. 8 and by part (b) of FIG. 9. As shown in part (b) of FIG. 9, the transfer gate 122 may be controlled such that a potential of the transfer portion 114b is lower than a potential of the first portion 114a during accumulating of charges such that charges may not be transferred from the first portion 114a towards the second portion 114c.

Right after the reset transistor 304 is closed, a reset signal voltage may be sampled from the floating diffusion node 302, indicated by timing c in FIG. 8 and by part (c) of FIG. 9.

Then charges may be transferred from the first portion 114a of the charge transport layer 114 to the floating diffusion node 302. This may be achieved by lowering the gate voltage and applying a high voltage on the transfer gate 122, indicated by timing d in FIG. 8 and by part (d) of FIG. 9. The low gate voltage may be set to fully deplete the first portion 114a of the charge transport layer 114. The low gate voltage may be set in relation to the voltage applied to the top electrode 120. In one embodiment, the low gate voltage may 0 or a negative voltage.

As shown in part (d) of FIG. 9, the transfer gate 122 may be controlled such that a potential of the transfer portion 114b is set to be higher than a potential of the first portion 114a and lower than a potential of the second portion 114c during transferring of charges such that charges are transferred from the first portion 114a to the transfer portion 114b and further to the second portion 114c.

After charges are transferred from first portion 114a of the charge transport layer 114 to the floating diffusion node 302, a signal voltage level may be sampled from the floating diffusion node 302, indicated by timing e in FIG. 8 and by part (e) of FIG. 9. By the transfer of charge from the first portion 114a of the charge transport layer 114, the first portion 114a of the charge transport layer 114 may be fully depleted and may thus be ready for a subsequent accumulation of charges, because the first portion 114a is back in an empty state (without any reset noise).

Figure 10:
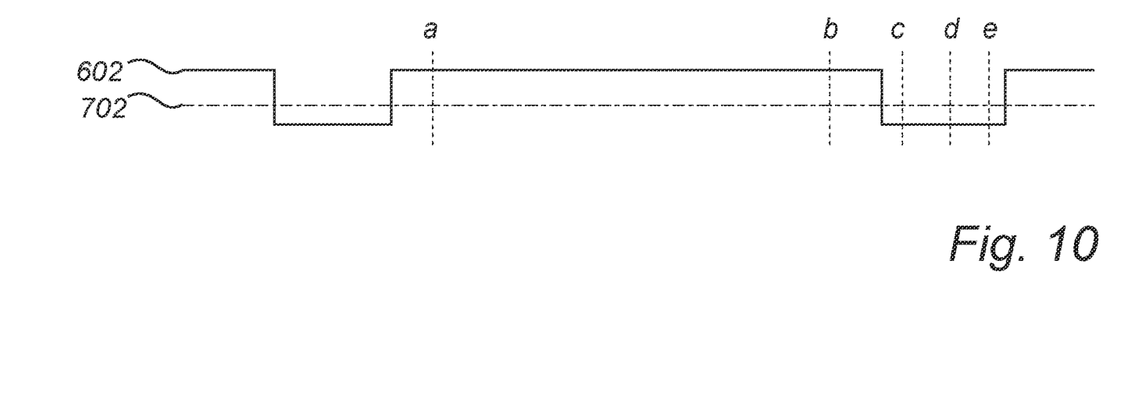
FIG. 10 is a schematic view illustrating an alternative control signal to a gate of the photo-sensitive device.

Referring now to FIG. 10, instead of the varying control signal 602 provided to the gate 110, a constant gate voltage may be provided. In FIG. 10, a DC signal 702 is illustrated in relation to the control signal 602. Thus, with a proper level of the DC signal 702, a constant gate voltage may be provided. In this embodiment, the transfer gate 122 may be controlled such that a potential of the transfer portion 114b is lower than a potential of the first portion 114a during accumulating of charges such that charges may not be transferred from the first portion 114a towards the second portion 114c. Further, the transfer gate 122 may be controlled such that a potential of the transfer portion 114b is set to be higher than a potential of the first portion 114a and lower than a potential of the second portion 114c during transferring of charges such that charges are transferred from the first portion 114a to the transfer portion 114b and further to the second portion 114c.

In the above the inventive concept has mainly been described with reference to a limited number of examples. However, as is readily appreciated by a person skilled in the art, other examples than the ones disclosed above are equally possible within the scope of the inventive concept, as defined by the appended claims.

The invention claimed is:

1. A photo-sensitive device comprising a layer structure, said photo-sensitive device comprising:
   an active layer, wherein the active layer is configured to generate charges in response to incident light on the active layer;
   a charge transport layer separate and distinct from the active layer, wherein the charge transport layer is formed of a semiconductor and comprises a first portion and a second portion, the second portion being laterally displaced in a plane of the charge transport layer in relation to the first portion;
   a gate separated by a dielectric material from the first portion of the charge transport layer, wherein said gate and said charge transport layer are arranged such that the first portion of the charge transport layer is between the gate and the active layer and wherein the gate is configured to control a potential of the first portion of the charge transport layer, wherein the gate and the active layer are arranged on opposite sides of the charge transport layer; and
   a transfer gate, which is arranged to be separated by a dielectric material from a transfer portion of the charge transport layer between the first portion and the second portion, wherein the transfer gate is configured to control transfer of accumulated charges in the first portion to the second portion for read-out of detected light by the photo-sensitive device.

2. The photo-sensitive device according to claim 1, wherein the gate is configured to provide a voltage for fully depleting the first portion of the charge transport layer.

3. The photo-sensitive device according to claim 1, wherein the active layer and charge transport layer are arranged on a read-out integrated circuit substrate.

4. The photo-sensitive device according to claim 1, wherein the active layer comprises a quantum dot, an organic photodetector material or a perovskite material.

5. The photo-sensitive device according to claim 1, wherein the active layer and charge transport layer are formed using thin-film layer deposition.

6. The photo-sensitive device according to claim 1, wherein the charge transport layer is an electron transport layer and wherein the photo-sensitive device further comprises a hole transport layer arranged such that the active layer is between the hole transport layer and the electron transport layer.

7. The photo-sensitive device according to claim 6, further comprising a top electrode layer arranged above the hole transport layer, wherein the top electrode layer is configured to control a potential of the hole transport layer.

8. The photo-sensitive device according to claim 1, wherein the charge transport layer is formed by a metal-oxide semiconductor.

9. The photo-sensitive device according to claim 1, wherein the gate and the transfer gate are arranged on different sides of the charge transport layer or the gate and the transfer gate are arranged on a same side of the charge transport layer or the transfer gate comprises a first portion and a second portion, wherein the first portion of the transfer gate and the second portion of the transfer gate are arranged on opposite sides of the charge transport layer.

10. An image sensor comprising an array of photo-sensitive devices according to claim 1.

11. The image sensor according to claim 10, wherein at least a second portion of a first photo-sensitive device in the array and a second portion of a second photo-sensitive device in the array are shared in the charge transport layer.

12. A method for light detection in a photo-sensitive device comprising a layer structure, said method comprising:
 generating charges in an active layer in response to incident light on the active layer;
 accumulating charges, based on the generated charges, in a first portion of a charge transport layer that is separate and distinct from the active layer;
 transferring charges from the first portion of the charge transport layer to a second portion of the charge transport layer, the second portion being laterally displaced in a plane of the charge transport layer in relation to the first portion, said transferring of charges being controlled by a signal to a transfer gate, wherein the transfer gate is arranged to be separated by a dielectric material from a transfer portion of the charge transport layer between the first portion and the second portion, wherein the transfer gate and the active layer are arranged on opposite sides of the charge transport layer; and
 reading out a signal from the second portion of the charge transport layer as a representation of an amount of incident light on the active layer.

13. The method according to claim 12, further comprising, before generating of charges in the active layer, depleting the charge transport layer based on a voltage provided to a gate separated by a dielectric material from the charge transport layer, wherein said gate and said charge transport layer are arranged such that the first portion of the charge transport layer is between the gate and the active layer.

14. The method according to claim 13, wherein the charge transport layer is an electron transport layer, wherein the transfer gate is controlled such that a potential of the transfer portion is lower than a potential of the first portion during accumulating of charges, and wherein the transfer gate is controlled such that a potential of the transfer portion is set to be higher than a potential of the first portion and lower than a potential of the second portion during transferring of charges.

15. The method according to claim 14, wherein a constant gate voltage is provided to the gate throughout said depleting, generating, accumulating and transferring.

* * * * *